United States Patent [19]

Bossen et al.

[11] Patent Number: 5,956,351
[45] Date of Patent: Sep. 21, 1999

[54] DUAL ERROR CORRECTION CODE

[75] Inventors: Douglas Craig Bossen, Austin, Tex.; Chin-Long Chen, Fishkill, N.Y.

[73] Assignee: International Business Machines Corporation, Armonk, N.Y.

[21] Appl. No.: 08/834,962

[22] Filed: Apr. 7, 1997

[51] Int. Cl.$^6$ .................................................. H03M 13/00
[52] U.S. Cl. ...................... 371/37.6; 371/37.8; 371/40.18
[58] Field of Search ................................ 371/37.6, 37.8, 371/40.11, 40.12, 40.17, 40.18, 51.1

[56] References Cited

U.S. PATENT DOCUMENTS

| | | | |
|---|---|---|---|
| 4,359,772 | 11/1982 | Patel | 371/39 |
| 4,402,045 | 8/1983 | Krol | 364/200 |
| 4,538,270 | 8/1985 | Goodrich, Jr. et al. | 371/37 |
| 4,958,350 | 9/1990 | Worley, III et al. | 371/37.4 |
| 5,068,858 | 11/1991 | Blaum et al. | 371/41 |
| 5,224,167 | 6/1993 | Taniguchi et al. | 381/36 |
| 5,355,377 | 10/1994 | Venkidu et al. | 371/51.1 |
| 5,418,796 | 5/1995 | Price et al. | 371/39.1 |
| 5,425,038 | 6/1995 | Chen | 371/37.1 |
| 5,450,423 | 9/1995 | Iwasaki et al. | 371/40.1 |
| 5,515,507 | 5/1996 | Byers et al. | 395/185.09 |
| 5,541,941 | 7/1996 | Dell et al. | 371/49.3 |

*Primary Examiner*—Stephen M. Baker
*Attorney, Agent, or Firm*—Volel Emile; Jack V. Musgrove; Andrew J. Dillon

[57] ABSTRACT

A method of detecting errors in a data stream being transmitted in a computer system, e.g., from a memory array to a memory controller, by determining whether the encoding was performed using a first encoding method or a second encoding method, and thereafter decoding the data stream using a logic circuit based on a single parity-check matrix. The entire parity-check matrix is used to decode the data stream if the first encoding method was used, and a subset of the parity-check matrix is used to decode the data stream if the second encoding method was used. Encoding according to the first method allows correction of all single-symbol errors and detection of all double-symbol errors in the data stream, and encoding according to the second method allows correction of all single-bit errors and detection of all double-bit errors in the data stream. The subset matrix may be permuted if the second encoding method was used, to create a permuted matrix further allowing detection of single-symbol errors. In an exemplary embodiment, the parity-check matrix is a (76,66) matrix and the subset of the parity-check matrix is a (72,64) matrix.

18 Claims, 8 Drawing Sheets

FETCHED DATA AND CHECK BITS 0  1          63  74 M  75 M

● ● ●

XOR TREE FOR

MATRIX A

M 0  1  ● ● ●  7
                  8  9

SYNDROME BITS

```
                              1  1  1  1  1  1  1  1  1  | Symbol ID
 0  1  2  3  4  5  6  7  8  9 0  1  2  3  4  5  6  7  8  |

11 11 11 11 11 22 22 22 22 22 33 33 33 33 | Bit
01 23 45 67 89 01 23 45 67 89 01 23 45 67 89 01 23 45 67 | Position 00 11 00 10 10 00 01 11 00 01 10 00 10 01 11 01 10 00 11 | Matrix A
00 10 00 01 01 00 11 10 00 11 01 00 01 11 10 11 01 00 10 |
01 11 10 11 10 00 00 01 00 11 10 01 11 00 10 00 00 11 11 |
11 10 01 10 01 00 00 11 00 10 01 11 10 00 01 00 00 10 10 |
10 10 01 11 00 11 00 00 01 00 10 01 01 10 01 01 11 10 00 |
01 01 11 10 00 10 00 00 11 00 01 11 11 01 11 11 10 01 00 |
01 00 01 00 10 01 11 00 11 00 00 10 10 01 10 10 11 11 10 |
11 00 11 00 01 11 10 00 10 00 00 01 01 11 01 01 10 10 01 |
00 00 00 00 10 11 01 01 11 01 01 10 00 10 00 10 01 01 01 |
00 00 00 00 01 10 11 11 10 11 11 01 00 01 00 01 11 11 11 |

1  2  2  2  2  2  2  2  2  2  3  3  3  3  3  3  3  3    Symbol ID
 9  0  1  2  3  4  5  6  7  8  9  0  1  2  3  4  5  6  7

33 44 44 44 44 44 55 55 55 55 55 66 66 66 66 66 77 77 77  Bit
89 01 23 45 67 89 01 23 45 67 89 01 23 45 67 89 01 23 45  Position 01 00 10 00 01 11 01 11 10 11 10 11 11 10 00 00 00 00 01  Matrix A
11 00 01 00 11 10 11 10 01 10 01 10 10 01 00 00 00 00 11
01 11 00 10 01 10 11 11 01 10 11 01 01 00 10 00 00 00 11
11 10 00 01 11 01 10 10 11 01 10 11 11 00 01 00 00 00 10
10 11 01 11 00 11 01 11 11 10 10 01 11 00 00 10 00 00 11
01 10 11 10 00 10 11 10 10 01 01 11 10 00 00 01 00 00 10
00 10 01 11 10 00 01 01 10 01 01 01 11 00 00 00 10 00 11
00 01 11 10 01 00 11 11 01 11 11 11 10 00 00 00 01 00 10
01 11 11 01 11 01 00 00 01 11 01 11 11 00 00 00 00 10 11
11 10 10 11 10 11 00 00 11 10 11 10 10 00 00 00 00 01 10
```

*Fig. 2*

```
                        11 11 11 11 11 22 22 22 22 22 33 33 33 | Bit
      01 23 45 67 89 01 23 45 67 89 01 23 45 67 89 01 23 45 | Position 00 11 00 10 10 00 01 11 00 01 10 00 10 01 11 01 10 00 | Matrix B
      00 10 00 01 01 00 11 10 00 11 01 00 01 11 10 11 01 00
      01 11 10 11 10 00 00 01 00 11 10 01 11 00 10 00 00 11
      11 10 01 10 01 00 00 11 00 10 01 11 10 00 01 00 00 10
      10 10 01 11 00 11 00 00 01 00 10 01 01 10 01 01 11 10
      01 01 11 10 00 10 00 00 11 00 01 11 11 01 11 11 10 01
      01 00 01 00 10 01 11 00 11 00 00 10 10 01 10 10 11 11
      11 00 11 00 01 11 10 00 10 00 00 01 01 11 01 01 10 10
```

```
      |33 33 44 44 44 44 44 55 55 55 55 55 66 66 66 66 66 77  Bit
      |67 89 01 23 45 67 89 01 23 45 67 89 01 23 45 67 89 01  Position

|11 01 00 10 00 01 11 01 11 10 11 10 11 11 10 00 00 00  Matrix B
      |10 11 00 01 00 11 10 11 10 01 10 01 10 10 01 00 00 00
      |11 01 11 00 10 01 10 11 11 01 10 11 01 01 00 10 00 00
      |10 11 10 00 01 11 01 10 10 11 01 10 11 11 00 01 00 00
      |00 10 11 01 11 00 11 01 11 11 10 10 01 11 00 00 10 00
      |00 01 10 11 10 00 10 11 10 10 01 01 11 10 00 00 01 00
      |10 00 10 01 11 10 00 01 01 10 01 01 01 11 00 00 00 10
      |01 00 01 11 10 01 00 11 11 01 11 11 11 10 00 00 00 01
```

Matrix B1

| Symbol ID | 0 | 1 | 2 | 3 | 4 | 5 | 6 | 7 | 8 | 9 | 10 | 11 | 12 | 13 | 14 | 15 | 16 | 17 |
|---|---|---|---|---|---|---|---|---|---|---|---|---|---|---|---|---|---|---|
| 0 | 0011 | 0101 | 1110 | 1100 | 0010 | 0111 | 1000 | 0111 | 0001 | 0110 | 0100 | 1111 | 1101 | 0010 | 1010 | 1000 | 0100 | 0100 |
| 1 | 0011 | 0111 | 1000 | 0100 | 0000 | 0001 | 0100 | 1111 | 0110 | 0000 | 1011 | 1110 | 0110 | 0101 | 1100 | 0000 | 0100 | 1110 |
| 2 | 0110 | 1011 | 1010 | 1010 | 1000 | 0110 | 1001 | 1011 | 0101 | 0100 | 0101 | 0111 | 1100 | 0111 | 1001 | 1110 | 1001 | 0110 |
| 3 | 1001 | 1010 | 1100 | 0011 | 0010 | 1001 | 1110 | 0011 | 0101 | 0100 | 0110 | 1011 | 0100 | 0100 | 0000 | 0100 | 0010 | 0111 |
| 4 | 1110 | 0111 | 1110 | 0011 | 0000 | 1001 | 1001 | 1000 | 1011 | 1100 | 0010 | 0111 | 0010 | 0000 | 1101 | 0100 | 1011 | 0111 |
| 5 | 1111 | 0111 | 1110 | 1010 | 1110 | 1001 | 0100 | 0100 | 1010 | 0000 | 0101 | 0111 | 1110 | 0110 | 0010 | 1101 | 0110 | 1000 |
| 6 | 0111 | 1100 | 0101 | 0111 | 0110 | 1001 | 0101 | 0100 | 0010 | 1101 | 1101 | 0001 | 0011 | 1100 | 0100 | 0010 | 1110 | 0110 |
| 7 | 0110 | 0010 | 0010 | 0110 | 1111 | 1101 | 0010 | 0101 | 1011 | 1000 | 1001 | 0011 | 1000 | 0100 | 0010 | 0110 | 0111 | 0000 |
| 8 | 0110 | 0010 | 0110 | 0110 | 1111 | 1101 | 0010 | 0101 | 1011 | 1000 | 1001 | 0011 | 1000 | 0100 | 0010 | 0110 | 0111 | 0000 |
| 9 | 1111 | 1111 | 0110 | 0110 | 1011 | 1011 | 1011 | 0111 | 1010 | 1001 | 0011 | 0000 | 0000 | 0010 | 0100 | 0100 | 0000 | 1010 |

```
( 0   44   51   60)
( 1   31   55   56)
( 2   29   53   69)
( 3   13   23   45)
( 4   16   57   71)
( 5    8   37   62)
( 6    9   22   41)
( 7   27   36   47)
(10   18   43   58)
(11   63   64   70)
(12   24   38   59)
(14   48   52   61)
(15   28   33   54)
(17   25   49   65)
(19   30   42   66)
(20   34   35   68)
(21   32   40   46)
(26   39   50   67)
```

| Symbol ID | 0 | 1 | 2 | 3 | 4 | 5 | 6 | 7 | 8 | 9 | 10 | 11 | 12 |
|---|---|---|---|---|---|---|---|---|---|---|---|---|---|
| | 000 | 110 | 000 | 101 | 101 | 000 | 011 | 110 | 000 | 011 | 101 | 000 | 101 |
| | 000 | 101 | 000 | 011 | 011 | 000 | 110 | 101 | 000 | 110 | 011 | 000 | 011 |
| | 011 | 110 | 101 | 110 | 101 | 000 | 000 | 011 | 000 | 110 | 101 | 011 | 110 |
| | 110 | 101 | 011 | 101 | 011 | 000 | 000 | 110 | 000 | 101 | 011 | 110 | 101 |
| | 101 | 101 | 011 | 110 | 000 | 110 | 000 | 000 | 011 | 000 | 101 | 011 | 011 |
| | 011 | 011 | 110 | 101 | 000 | 101 | 000 | 000 | 110 | 000 | 011 | 110 | 110 |
| | 011 | 000 | 011 | 000 | 101 | 011 | 110 | 000 | 110 | 000 | 000 | 101 | 101 |
| | 110 | 000 | 110 | 000 | 011 | 110 | 101 | 000 | 101 | 000 | 000 | 011 | 011 |
| | 000 | 000 | 000 | 000 | 101 | 110 | 011 | 011 | 110 | 011 | 011 | 101 | 000 |
| | 000 | 000 | 000 | 000 | 011 | 101 | 110 | 110 | 101 | 110 | 110 | 011 | 000 |

| Symbol ID | 13 | 14 | 15 | 16 | 17 | 18 | 19 | 20 | 21 | 22 | 23 | 24 | 25 |
|---|---|---|---|---|---|---|---|---|---|---|---|---|---|
| | 011 | 110 | 011 | 101 | 000 | 110 | 011 | 000 | 101 | 000 | 011 | 110 | 011 |
| | 110 | 101 | 110 | 011 | 000 | 101 | 110 | 000 | 011 | 000 | 110 | 101 | 110 |
| | 000 | 101 | 000 | 000 | 110 | 110 | 011 | 110 | 000 | 101 | 011 | 101 | 110 |
| | 000 | 011 | 000 | 000 | 101 | 101 | 110 | 101 | 000 | 011 | 110 | 011 | 101 |
| | 101 | 011 | 011 | 110 | 101 | 000 | 101 | 110 | 011 | 110 | 000 | 110 | 011 |
| | 011 | 110 | 110 | 101 | 011 | 000 | 011 | 101 | 110 | 101 | 000 | 101 | 110 |
| | 011 | 101 | 101 | 110 | 110 | 101 | 000 | 101 | 011 | 110 | 101 | 000 | 011 |
| | 110 | 011 | 011 | 101 | 101 | 011 | 000 | 011 | 110 | 101 | 011 | 000 | 110 |
| | 101 | 000 | 101 | 011 | 011 | 011 | 011 | 110 | 110 | 011 | 110 | 011 | 000 |
| | 011 | 000 | 011 | 110 | 110 | 110 | 110 | 101 | 101 | 110 | 101 | 110 | 000 |

| Symbol ID | 26 | 27 | 28 | 29 | 30 | 31 | 32 | 33 | 34 | 35 | 36 | 37 |
|---|---|---|---|---|---|---|---|---|---|---|---|---|
| | 110 | 101 | 110 | 101 | 110 | 110 | 101 | 000 | 000 | 000 | 000 | 011 |
| | 101 | 011 | 101 | 011 | 101 | 101 | 011 | 000 | 000 | 000 | 000 | 110 |
| | 110 | 011 | 101 | 110 | 011 | 011 | 000 | 101 | 000 | 000 | 000 | 110 |
| | 101 | 110 | 011 | 101 | 110 | 110 | 000 | 011 | 000 | 000 | 000 | 101 |
| | 110 | 110 | 101 | 101 | 011 | 110 | 000 | 000 | 101 | 000 | 000 | 110 |
| | 101 | 101 | 011 | 011 | 110 | 101 | 000 | 000 | 011 | 000 | 000 | 101 |
| | 011 | 101 | 011 | 011 | 011 | 110 | 000 | 000 | 000 | 101 | 000 | 110 |
| | 110 | 011 | 110 | 110 | 110 | 101 | 000 | 000 | 000 | 011 | 000 | 101 |
| | 000 | 011 | 110 | 011 | 110 | 110 | 000 | 000 | 000 | 000 | 101 | 110 |
| | 000 | 110 | 101 | 110 | 101 | 101 | 000 | 000 | 000 | 000 | 011 | 101 |

*Fig. 9*

DUAL ERROR CORRECTION CODE

BACKGROUND OF THE INVENTION

1. Field of the Invention

The present invention generally relates to computer systems and, more particularly, to a method of implementing error correction codes in an error detection or correction device such as a memory controller.

2. Description of the Related Art

The basic structure of a conventional computer system 10 is shown in FIG. 1. The heart of computer system 10 is a central processing unit (CPU) or processor 12 which is connected to several peripheral devices, including input/output (I/O) devices 14 (such as a display monitor and keyboard) for the user interface, a permanent memory device 16 (such as a hard disk or floppy diskette) for storing the computer's operating system and user programs, and a temporary memory device 18 (such as dynamic random-access memory or DRAM) that is used by processor 12 to carry out program instructions. Processor 12 communicates with the peripheral devices by various means, including a bus 20 or a direct channel 22. Computer system 10 may have many additional components which are not shown, such as serial and parallel ports for connection to, e.g., modems or printers. Those skilled in the art will further appreciate that there are other components that might be used in conjunction with those shown in the block diagram of FIG. 1; for example, a display adapter connected to processor 12 might be used to control a video display monitor. Computer system 10 also includes firmware 24 whose primary purpose is to seek out and load an operating system from one of the peripherals (usually permanent memory device 16) whenever the computer is first turned on.

Parity checks and error correction codes (ECCs) are commonly used to ensure that data is properly transferred between system components. For example, a magnetic disk (permanent memory device) typically records not only information that comprises data to be retrieved for processing, but also records an error correction code for each file, which allows the processor, or a controller, to determine whether the data retrieved is valid. ECCs are also used with temporary memory devices, e.g., DRAM, and the ECC for files stored in DRAM can be analyzed by a memory controller which provides an interface between the processor and the DRAM array. If a memory cell fails during reading of a particular memory word (due to, e.g. stray radiation, electrostatic discharge, or a defective cell), then the failure can at least be detected. ECCs can further be used to reconstruct the proper data stream. See, e.g., U.S. Pat. Nos. 4,402,045, 4,538,270.

Some error correction codes can only be used to detect single-bit errors, i.e., if two or more bits in a particular memory word are invalid, then the ECC might not be able to determine what the proper data stream should actually be. Other ECCs are more sophisticated and allow detection or correction of double errors, and some ECCs further allow the memory word to be broken up into clusters of bits, or "symbols," which can then be analyzed for errors in more detail, such as the ECCs described in U.S. Pat. Nos. 4,359,772, 4,958,350 and 5,450,423. ECCs commonly use parity check matrices, as taught in U.S. Pat. No. 5,425,038.

Different computer systems may require different error correction routines depending upon system architecture. For example, the RS/6000 and AS/400 computer systems of International Business Machines Corporation have substantially different requirements for their memory card designs, due to both data word definition (64 bits versus 65 bits) and correction capability (single-bit correct per word vs. 2-adjacent-bit correct per word). There are valid architectural, engineering, and business justifications for these differences, but the differences lead to the requirement of providing different memory controllers for different systems. Thus, if a memory controller were designed to function with more than one architecture, it would have to possess two completely separate and redundant ECC implementations, selected by a mode bit.

For example, for a memory array having a "b-bit-per-chip" configuration, the proper ECC is one that is capable of correcting all single symbol errors and detecting all double-symbol errors, where a symbol error is any one of the $2^b-1$ error patterns generated from a failure of an array chip. Using this SSC-DSD code (single-symbol-correction, double-symbol-detection), the memory may continue to function as long as there is no more than one chip failure in the group of array chips covered by the same ECC word. All errors generated from a single chip failure are automatically corrected by the ECC, regardless of the failure mode of the chip. Sometime later, when a second chip in the same chip group fails, double-symbol errors may be present if the locations of the two chip failures line up in the same ECC words. These double-symbol errors would be detected by the ECC. To prevent a data loss in this case, a proper maintenance strategy is executed so that the number of symbol errors does not accumulate beyond two.

Another class of ECCs is the SEC-DED-SSD codes (single-error-correction, double-error-detection, single-symbol-detect) that are capable of correcting all single bit errors, detecting all double bit errors, and detecting all single symbol errors. SEC-DED-SSD codes are not as powerful in correcting and detecting symbol errors as SSC-DSD codes. However, an SEC-DED-SSD code requires a fewer number of check bits and, thus, a fewer number of redundant array chips, as compared to an SSC-DSD code with the same number of data bits.

A common memory control chip (or chips) may be used to support different memory subsystems, for economical reasons. Consider the case where memory subsystem A is configured in 2 bits per chip, and memory subsystem B is configured in 4 bits per chip. In addition, subsystem A is to use a (76,66) SSC-DSD code (76 total bits of information per code word, 66 bits of data, i.e., 10 check bits) with b=2, and subsystem B is to use a (72,64) SEC-DED-SSD code with b=4 (72 total bits of information per code word, 64 bits of data, i.e., 8 check bits). Present techniques require two separate ECC designs to be implemented in the common memory logic, making a more redundant (and expensive) system. It would, therefore, be desirable and advantageous to devise a method of incorporating two or more ECC implementations into a single design.

SUMMARY OF THE INVENTION

It is therefore one object of the present invention to provide a method of detecting errors in a data stream being transmitted in a computer system.

It is another object of the present invention to provide such a method wherein the device is a memory controller receiving information from a temporary memory device such as DRAM.

It is yet another object of the present invention to provide such a method which incorporates two or more error-correcting code implementations in a single, more efficient design.

The foregoing objects are achieved in a method of detecting errors in a data stream being transmitted in a computer system (e.g., from a memory array to a memory controller), generally comprising the steps of encoding parity check bits into the data stream using either a first encoding method or a second encoding method, then determining whether the encoding was performed using the first encoding method or the second encoding method, and thereafter decoding the data stream using a logic circuit having means for decoding the data stream according to either the first encoding method or the second encoding method. Decoding is accomplished using a logic circuit based on a single parity-check matrix. The entire parity-check matrix is used to decode the data stream if the first encoding method was used, and a subset of the parity-check matrix is used to decode the data stream if the second encoding method was used. Encoding, according to the first method, allows correction of all single symbol errors and detection of all double-symbol errors in the data stream, and encoding, according to the second method, allows correction of all single-bit errors and detection of all double-bit errors in the data stream. The subset matrix may be permuted if the second encoding method was used, to create a permuted matrix further allowing detection of single symbol errors. In an exemplary embodiment, the parity-check matrix is a (76,66) matrix, and the subset of the parity-check matrix is a (72,64) matrix. The logic circuit does not use values in the single parity-check matrix which are not in the subset of the single parity-check matrix to decode the data stream if the second encoding method was used.

The above as well as additional objectives, features, and advantages of the present invention will become apparent in the following detailed written description.

BRIEF DESCRIPTION OF THE DRAWINGS

The novel features believed characteristic of the invention are set forth in the appended claims. The invention itself, however, as well as a preferred mode of use, further objectives, and advantages thereof, will best be understood by reference to the following detailed description of an illustrative embodiment when read in conjunction with the accompanying drawings, wherein:

FIG. 2 is a depiction of one embodiment of an error correction code constructed in accordance with the present invention, having a (76,66) parity-check matrix;

FIG. 3 is a depiction of another error correction code constructed in accordance with the present invention, having a (72,64) parity-check matrix which is a subset of the (76,66) matrix of FIG. 2;

FIG. 4 is a depiction of yet another error correction code constructed in accordance with the present invention, having a (72,64) parity-check matrix which is a permutation of the (72,64) matrix of FIG. 3;

FIG. 9 is a depiction of one embodiment of a syndrome-decoding table constructed in accordance with the present invention, to be used with the matrices of FIGS. 2 and 3.

DESCRIPTION OF THE PREFERRED EMBODIMENT

In the present invention, an innovative approach is provided that incorporates multiple error correction code techniques into a single design. This technique can be conveniently implemented with error-correcting code matrices. For example, a (76,66) ECC (code A) and a (72,64) ECC (code B) can be combined into one design. The parity-check matrix of code A contains as a submatrix the parity-check matrix of code B. Thus, the hardware for the implementation of code B is imbedded into the hardware for code A. The hardware complexity of both codes is practically reduced to that of code A.

A binary (n,k) code is a k-dimensional subspace of an n-dimensional binary vector space. The vectors in the subspace are the code words of the ECC. These code words have to satisfy a set of r=n−k linearly independent equations that define the code (vector subspace). The parameter n is the code length, k is the number of data bits, and r is the number of ECC bits or check bits. If $W=(W_0, W_1, \ldots, W_{n-1})$ is a code word with n bits, the set of equations that define the ECC can be expressed as $HW^1=0 \bmod 2$, where $W^1$ is the transpose of W, and H is an r×n binary matrix. Matrix H is called the parity-check matrix of the ECC.

With reference now to the figures, and in particular with reference to FIG. 2, there is depicted a parity-check matrix A defining a (76,66) ECC for symbol error correction and detection. There are two headings for matrix A. The first heading shows the symbol positions assigned from 0 to 37 for the 38 pairs of columns of the matrix. The second heading shows the bit positions assigned from 0 to 75 for the columns. The 10×76 binary matrix in FIG. 2 is the actual parity-check matrix. It can be shown that parity-check matrix A defines a (76,66) SSD-DSD ECC with a symbol size b=2. This ECC is capable of correcting all single symbol errors and detecting all double-symbol errors in a 38-symbol code word. This code can be used to encode 66 data bits. It may also be used to encode 65 data bits plus a parity of the memory address, or 64 data bits plus two parity bits of the memory address.

Figure 1:
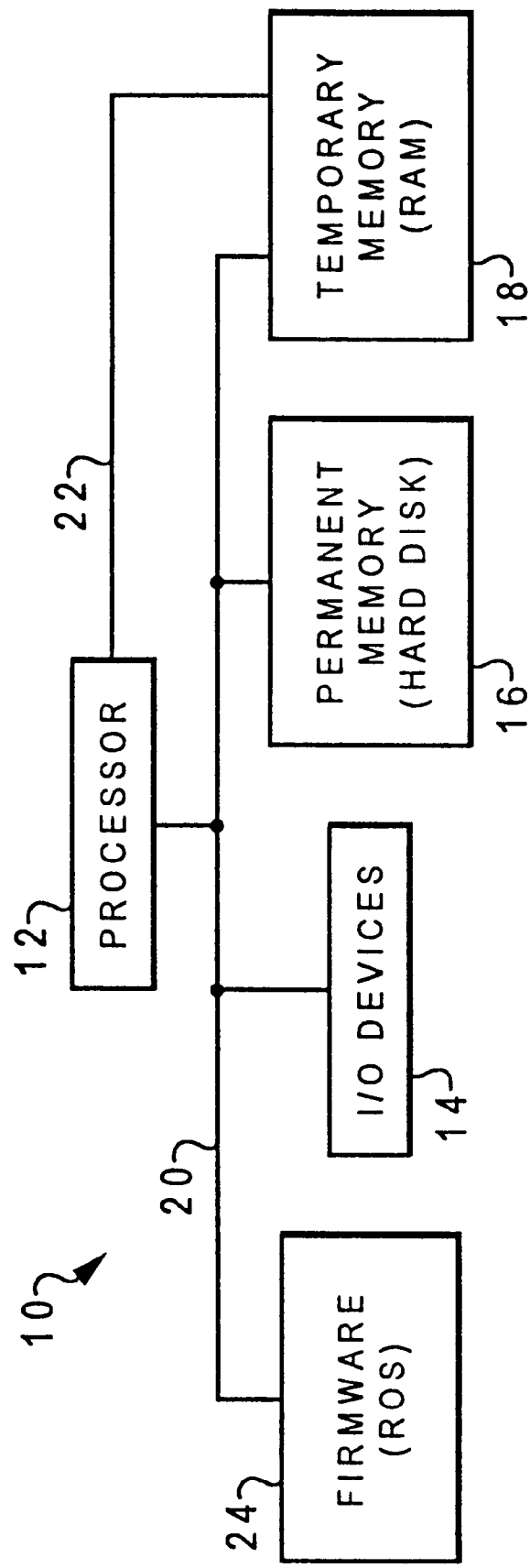
FIG. 1 is a block diagram of a conventional computer system.
Figures 5, 6:
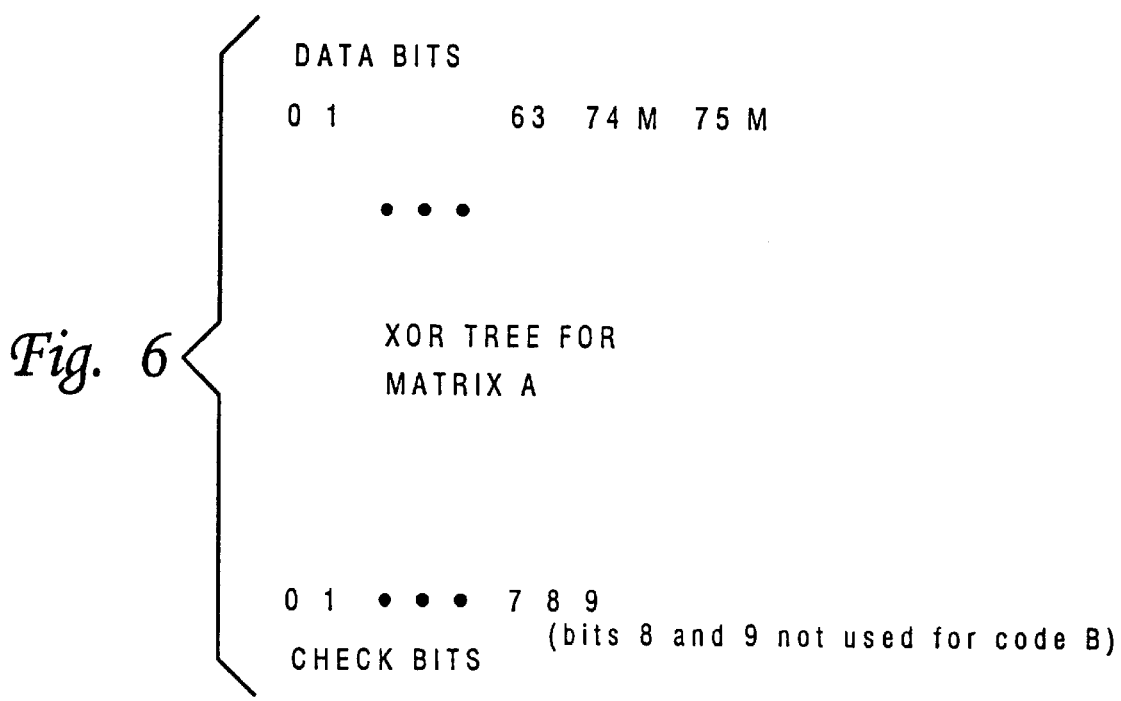
FIG. 5 is a depiction of a mapping sequence used to permute the matrix of FIG. 3 into the matrix of FIG. 4.
FIG. 6 is a depiction of an XOR gate tree for check-bit generation for dual code operation according to the present invention.

Another parity-check matrix B shown in FIG. 3, and defines a (72,64) SEC-DED code. This parity matrix is a submatrix of parity-check matrix A of FIG. 2. More specifically, the submatrix defined by the first 8 rows and the first 72 columns of matrix A is the same as matrix B. The (72,64) code defined by matrix B is not capable of detecting all single symbol errors with a symbol size b=4. However, the columns of matrix B may be permuted to provide a (72,64) SEC-DED-SSD code whose parity-check matrix B1 is shown in FIG. 4. The mapping of bit positions in 18 symbols of 4 bits from matrix B to matrix B1 is shown in FIG. 5. For example, bits 0, 44, 51, and 60 are grouped together to form the first symbol.

Referring to the (76,66) SSC-DSD code defined by matrix A of FIG. 2 as code A, and (72,64) SEC-DED-SSD code defined by matrix B1 of FIG. 3 as code B, because matrix B1 is a submatrix of matrix A, a common logic circuit may be used to implement both code A and code B. A mode bit M can be used to control the dual operation of the codes. For example, M is set to one for the operation of code A and M is set to zero for the operation of code B.

Figure 7:
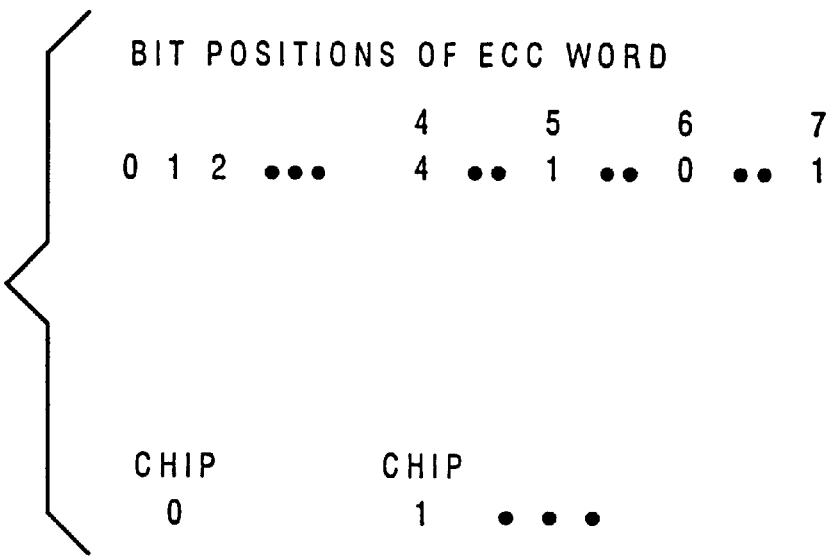
FIG. 7 is a depiction of bit-position assignments for different memory chips in a chip array.

Bits 64–73 in matrix A are designated as check bits 0–9. Check bit 0 is the XOR (exclusive OR) of the data bits masked by ones in the first row of matrix A. Check bit i is the XOR of the data bits masked by ones in the (i-1)th row of matrix A. In general, the check bits are generated from a set of 10 XOR trees with the data bits as inputs. The inputs to the XOR trees are modified to accommodate for the dual mode of ECC operations as shown in FIG. 6. Data bits 74 and 75 are gated by the mode bit M. For code A, M=1 and all 10 check bits are generated from all the data bits. For code B, M=0 and the first 8 check bits are generated from the first 64 data bits. In this case, the last two check bits are not used, i.e., they are not stored in the memory array. For the memory using code A, the data bits and the check bits are stored into the memory array in the natural sequential order as shown in FIG. 2, with a pair of bits going into the same array chip. For the memory using code B, the data bits and the check bits are permuted according to FIG. 5 with a group of 4 bits going into the same chip. For example, bits 0, 44, 51, and 60 are wired into array chip 0 as shown in FIG. 7.

Figure 8:
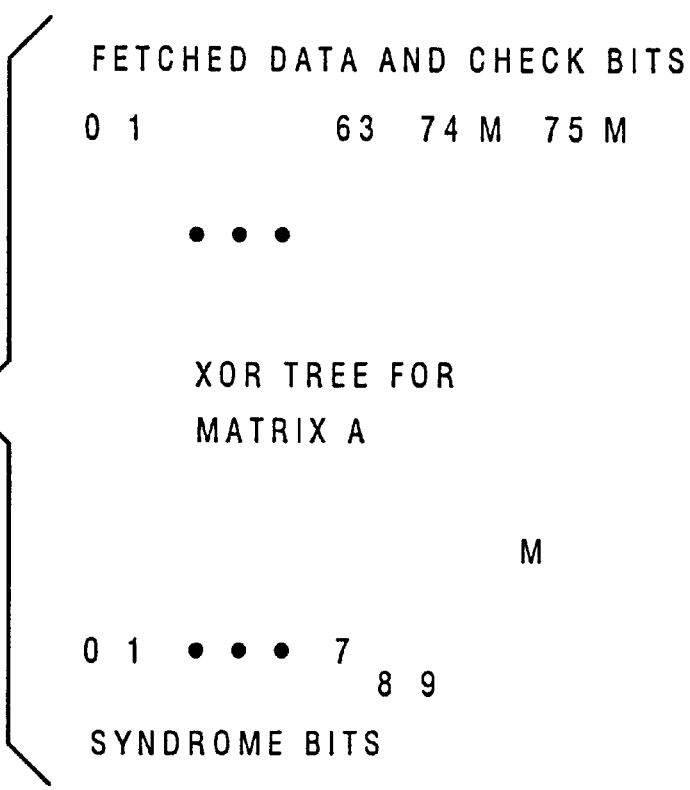
FIG. 8 is a depiction of an XOR gate tree for syndrome generation for dual code operation according to the present invention.

When data are fetched from the memory, syndrome bits 0–9 are generated from matrix A. Syndrome bit i is the XOR of the received bits masked by the ones in the (i-1)th row of matrix A. Again, bits 74 and 75 are gated by the mode bit M at the input of the XOR tree (FIG. 8). In addition, syndrome bits 8 and 9 at the output are also gated by M. These two syndrome bits are set to zero if M=0 (for code B).

If all 10 syndrome bits are zero, there is no error in the received data. If one or more syndrome bits is zero, the syndrome bits are used to determine if the errors are correctable and to determine the bit positions in errors (the syndrome-decoding process). There are three syndrome patterns to recognize for each 2-bit symbol position. A syndrome-decoding table is shown as a matrix in FIG. 9. There is a 10×3 submatrix associated with each of the 38 symbols. The following rules are used to determine if symbol i is in error:

1. If the syndrome matches the first column of the 3-column submatrix of symbol i, the first bit of symbol i is in error;
2. If the syndrome matches the second column of symbol i, the second bit of symbol i is in error; and
3. If the syndrome matches the third column of symbol i, both bits of symbol i are in error.

If the syndrome is not all zeros and the syndrome does not match any one of the columns in FIG. 9, the errors are uncorrectable (UE).

The matching of the syndrome against the columns of FIG. 9 can be implemented by a set of 10-input AND circuits. Either the true value or the complement of each of all 10 syndrome bits is used as an input to each of the AND circuits.

Figure 10:
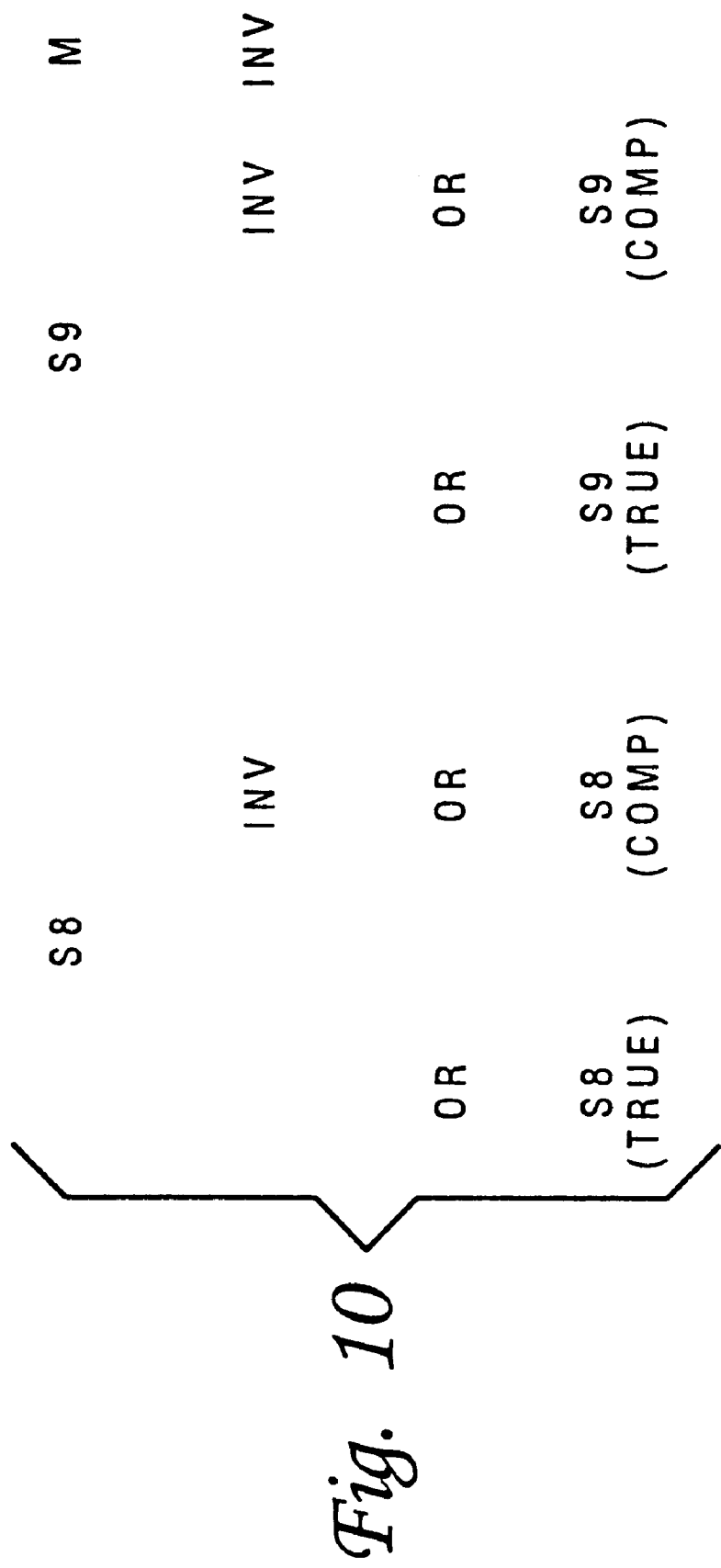
FIG. 10 is a depiction of modification of certain syndrome bits using OR circuits.

To incorporate dual ECC operation, both the true values and the complements of syndrome bits 8 and 9 are set to one for M=0. This can be done by OR circuits as shown in FIG. 10. The trues and the complements of the output syndrome bits 8 and 9 are used as the inputs to the AND circuits for syndrome decoding. The correction of errors is done by inverting the bits in error.

Although the invention has been described with reference to specific embodiments, this description is not meant to be construed in a limiting sense. Various modifications of the disclosed embodiment, as well as alternative embodiments of the invention, will become apparent to persons skilled in the art upon reference to the description of the invention. It is therefore contemplated that such modifications can be made without departing from the spirit or scope of the present invention as defined in the appended claims.

We claim:

1. A method of detecting errors in a data stream being transmitted in a computer system, comprising the steps of:

encoding parity-check bits into the data stream using either a first encoding method or a second encoding method;

determining whether said encoding step was performed using said first encoding method or said second encoding method; and decoding the data stream using a single parity-check matrix logic circuit having means for decoding the data stream according to either said first encoding method or said second encoding method in response to said determining step.

2. The method of claim 1 wherein a common logic circuit is used to implement both said first encoding method and said second encoding method.

3. The method of claim 1 wherein said decoding step further includes the step of creating a plurality of syndrome bits using a syndrome decoding table.

4. The method of claim 1 wherein:

the entire single parity-check matrix is used to decode the data stream if said first encoding method was used; and a subset of the single parity-check matrix is used to decode the data stream if said second encoding method was used.

5. The method of claim 4 wherein:

the single parity-check matrix is a (76,66) matrix and the subset of the single parity-check matrix is a (72,64) matrix; and said decoding step does not use values in the single parity-check matrix which are not in the subset of the single parity-check matrix, if said second encoding method was used.

6. The method of claim 4 wherein:

said first encoding method allows correction of all single symbol errors and detection of all double-symbol errors in the data stream; and said second encoding method allows correction of all single-bit errors and detection of all double-bit errors in the data stream.

7. The method of claim 6 wherein said decoding step includes the step of permuting the subset of the single parity-check matrix, if said second encoding method was used, to create a permuted matrix allowing detection of single symbol errors.

8. A device for detecting an error in a data stream being transmitted in a computer system, comprising:

a logic circuit having an array of gates for detecting errors in the data stream by either a first detection method associated with a first encoding method or a second detection method associated with a second encoding method, said logic circuit including means for determining whether the data stream was encoded using said first encoding method or said second encoding method, and based on a single parity-check matrix for decoding the data stream according to either said first encoding method or said second encoding method.

9. The device of claim 8 wherein:

said first encoding method allows correction of all single symbol errors and detection of all double-symbol errors in the data stream; and said second encoding method allows correction of all single-bit errors and detection of all double-bit errors in the data stream.

10. The device of claim 8 wherein:

the entire single parity-check matrix is used to decode the data stream if said first encoding method was used; and a subset of the single parity-check matrix is used to decode the data stream if said second encoding method was used.

11. The device of claim 10 wherein the single parity-check matrix is a (76,66) matrix, and the subset of the single parity-check matrix is a (72,64) matrix.

12. The device of claim 10 wherein said logic circuit permutes said subset of said single parity-check matrix, if said second encoding method was used, to create a permuted matrix allowing detection of single symbol errors.

13. A computer system comprising:

a processor;

a memory array; and means for transmitting information from said memory array to said processor, said transmitting means including a logic circuit having an array of gates for detecting errors in the data stream by either a first detection method associated with a first encoding method or a second detection method associated with a second encoding method, said logic circuit including means for determining whether the data stream was encoded using said first encoding method or said second encoding method, and based on a single parity-check matrix for decoding the data stream according to either said first encoding method or said second encoding method.

14. The computer system of claim 13 wherein said transmitting means comprises a memory controller having said logic circuit.

15. The computer system of claim 13 wherein:

said first encoding method allows correction of all single-symbol errors and detection of all double-symbol errors in the data stream; and said second encoding method allows correction of all single-bit errors and detection of all double-bit errors in the data stream.

16. The computer system of claim 13 wherein:

the entire single parity-check matrix is used to decode the data stream if said first encoding method was used; and a subset of the single parity-check matrix is used to decode the data stream if said second encoding method was used.

17. The computer system of claim 16 wherein said logic circuit permutes said subset of said single parity-check matrix, if said second encoding method was used, to create a permuted matrix allowing detection of single-symbol errors.

18. A method of detecting errors in a data stream being transmitted in a computer system, comprising the steps of:

encoding parity-check bits into the data stream using either a first encoding method or a second encoding method;

determining whether said encoding step was performed using said first encoding method or said second encoding method; and decoding the data stream using a logic circuit having means for decoding the data stream according to either said first encoding method or said second encoding method in response to said determining step, said decoding step further including the step of creating a plurality of syndrome bits using a syndrome decoding table.

* * * * *